United States Patent
Snyder

(10) Patent No.: US 9,702,059 B2
(45) Date of Patent: Jul. 11, 2017

(54) METHOD OF FABRICATING A UNIFORMLY ALIGNED PLANAR ARRAY OF NANOWIRES USING ATOMIC LAYER DEPOSITION

(71) Applicant: Steven Howard Snyder, Southfield, MI (US)

(72) Inventor: Steven Howard Snyder, Southfield, MI (US)

(*) Notice: Subject to any disclaimer, the term of this patent is extended or adjusted under 35 U.S.C. 154(b) by 262 days.

(21) Appl. No.: 14/479,760

(22) Filed: Sep. 8, 2014

(65) Prior Publication Data

US 2015/0132489 A1     May 14, 2015

Related U.S. Application Data

(60) Provisional application No. 61/878,198, filed on Sep. 16, 2013.

(51) Int. Cl.
| | |
|---|---|
| *C23C 16/00* | (2006.01) |
| *C30B 25/04* | (2006.01) |
| *C30B 25/18* | (2006.01) |
| *C30B 29/60* | (2006.01) |

(52) U.S. Cl.
CPC ............ *C30B 25/04* (2013.01); *C30B 25/186* (2013.01); *C30B 29/60* (2013.01)

(58) Field of Classification Search
CPC ....... B82B 3/00; B82B 3/0014; B82B 3/0038; B82Y 30/00
USPC .......................... 428/928; 427/248.1; 118/715
See application file for complete search history.

(56) References Cited

U.S. PATENT DOCUMENTS

| | | | |
|---|---|---|---|
| 9,076,813 B1* | 7/2015 | Lee | ............... H01L 29/66469 |
| 2012/0021248 A1* | 1/2012 | Myung | ............... B82B 3/0033 |
| | | | 428/672 |
| 2013/0149860 A1* | 6/2013 | Dasgupta | ............ H01L 31/0224 |
| | | | 438/660 |

* cited by examiner

*Primary Examiner* — Nina Bhat

(57) ABSTRACT

Invention for producing an orderly aligned horizontally planar array of nanowires comprising:

step 1) providing a template for producing nanowires in which the template comprises an alternating multilayer stack of substrate and inert insulating thin film layers; and step 2) fabricating an orderly aligned, horizontally planar array of nanowires by depositing atoms and/or molecules along the outer edges of the thin film substrate layers on at least one side of the template with the use of atomic layer deposition.

2 Claims, 2 Drawing Sheets

METHOD OF FABRICATING A UNIFORMLY ALIGNED PLANAR ARRAY OF NANOWIRES USING ATOMIC LAYER DEPOSITION

BACKGROUND OF THE INVENTION

Field of the Invention

In general, the field of the present invention pertains to methods of fabricating nanowires. More specifically, the field of the present invention pertains to scalable methods of fabricating orderly aligned, horizontally planar arrays of nanowires.

Prior Art

Prior art pertinent to the present invention includes bottom-up and top-down methods of fabricating nanowires. Wherein, such prior art methods have their respective disadvantages with respect to the structure, function, and/or the scalability of the nanowires which are fabricated. Respectively, the method of fabricating nanowires in the present invention proposes to have advantages over pertinent prior art with respect to the structure, function, and/or the scalability of the nanowires which are fabricated.

SUMMARY OF THE INVENTION

Invention for fabricating an orderly aligned horizontally planar array of nanowires comprising the following steps:

Step 1) Providing a template for producing nanowires in which the template comprises a multilayer stack of thin films which include alternating substrate and inert insulating thin film layers; and Step 2) Fabricating an orderly aligned, horizontally planar array of nanowires by depositing atoms and/or molecules along the outer edges of the thin film substrate layers on at least one side of the template with the use of atomic layer deposition.

BRIEF DESCRIPTION OF THE DRAWINGS

FIG. (1a) illustrates nanowire template (2) which includes an alternating multilayer stack of substrate and inert insulating thin film layers.

FIG. (1b) illustrates the nanowires grown upon the outer edges of the substrate layers along side (2') of template (2) by atomic layer deposition after template (2), which is illustrated in FIG. (1a), is rotated 90 degrees around the central axis normal to plane (10), which is also illustrated in FIG. (1a).

DETAILED DESCRIPTION OF THE INVENTION

Figure 1A:
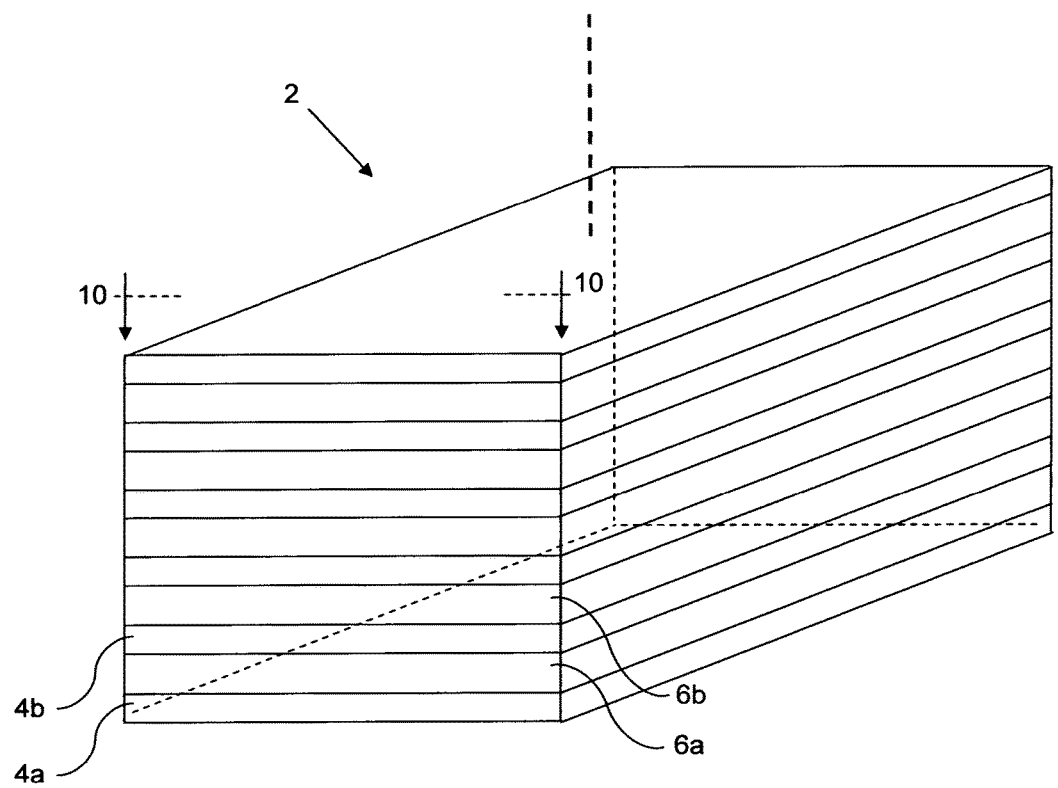

In the preferred embodiment of the present invention, an orderly aligned, horizontally planar array of nanowires is fabricated by a method which comprises the following steps:

Step 1) Providing nanowire template (2), which is illustrated in FIG. (1a). In which case, template (2) includes a multilayer stack of thin film layers comprising alternating growth substrate and inert insulating thin films which comprise the following: a) thin film substrate layers as illustrated in FIG. (1a), for example, by layers (4a) and (4b) which each comprise, for example, a silicon-based substrate material; and b) thin film inert insulating layers as illustrated in FIG. (1a), for example, by layers (6a) and (6b) which each comprise, for example, a silicon-based inert insulating material. (Note that the thick dashed line which is illustrated in FIG. (1a) is intended to indicate that the stack of thin film layers can include more thin film layers than the amount which is illustrated.); and Step 2) Fabricating an orderly aligned, horizontally planar array of nanowires as illustrated in FIG. (1b), for example, by nanowires (8a) and (8b) by depositing atoms and/or molecules, by way of an atomic layer deposition process, along the outer edges of the thin film growth substrate layers on side (2') of template (2) after rotating template (2), which is illustrated in FIG. (1a), 90 degrees around the central axis normal to plane (10), which is also illustrated in FIG. (1a). Wherein, the respective edges of the interposed inert insulating thin film layers resist chemisorption of the precursor material which is applied for growing the nanowires, and also insulate the nanowires by spatial separation or also electrical resistivity. (Note that the thick dashed line which is illustrated in FIG. (1b) is intended to indicate that the composite of thin film layers and respective nanowires can include more thin film layers and respective nanowires than the amount which is illustrated.)

Note that the width of a nanowire which is grown on a template can be varied by varying the thickness of the growth substrate layer upon which the respective nanowire is grown. While also, the height of a nanowire which is grown on a template can be varied by varying the number of cycles of atomic layer deposition which are applied to grow the respective nanowire in step (2). While furthermore, the spatial separation of nanowires which are grown on a template can be varied by varying the thickness of the respectively interposed inert insulating layers.

Also, note that a relatively large macroscopic size template or a relatively small microscopic size, e.g., island size, template could be applied to grow an array of nanowires. Wherein, the lengths of the nanowires would be varied along with the size of the template upon which the respective nanowire array is fabricated.

Furthermore, note that an array of nanowires can be shaped by fabricating the nanowires on a template which has the desired shape. Wherein, the nanowires and their respective template would consequentially have their desired shapes upon fabricating the nanowires on the shaped template.

Moreover, note that growth substrate layers can be made of different materials, such that the respective nanowires which are grown along the outer edges of the substrate layers can be made of different materials.

Still, note that a nanowire can be made of different materials along its length, i.e., segmented, by correspondingly varying the material constituting the respective growth substrate layer along its length.

Still even more, note that the variation of certain parameters, e.g., certain layout parameters, of the nanowires (and/or nanowire portions) which are grown on a template can be accomplished with the use of a masking and/or etching technique.

Figure 1B:
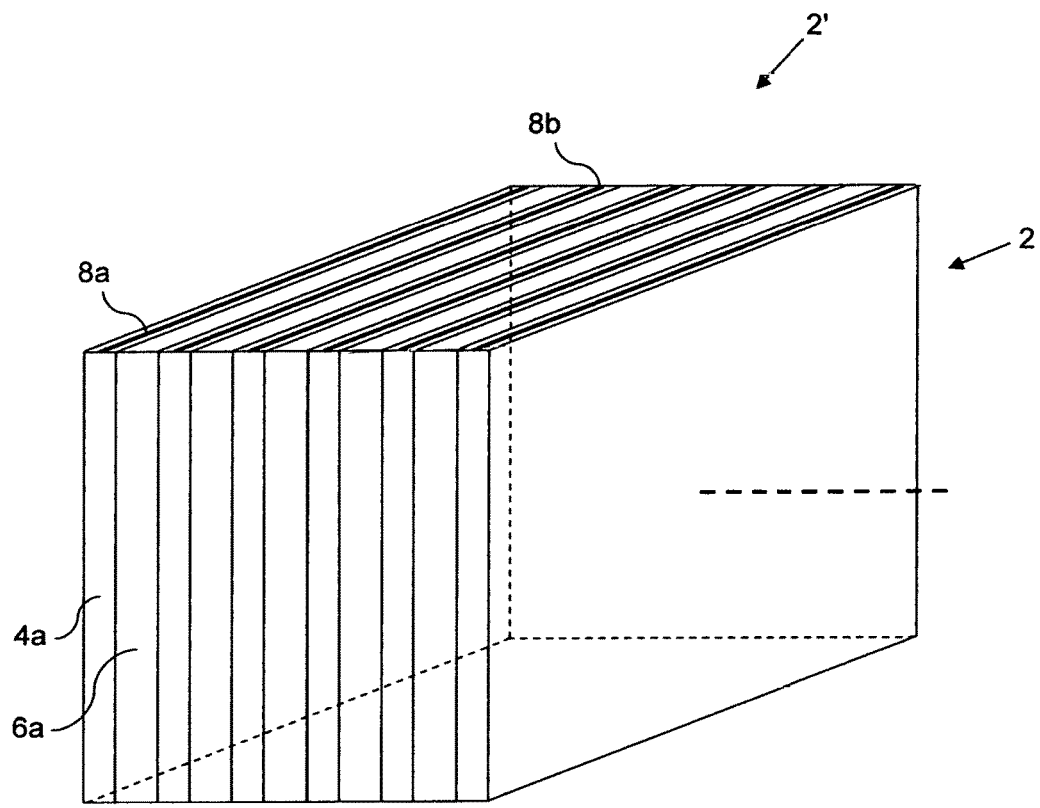

With respect to the drawings, note that the drawings are not drawn to scale for viewing purposes. While also with respect to the drawings, note that only the hidden outermost edges of the templates (which are illustrated in FIGS. 1a and 1b) are illustrated with dashed lines.

To broaden, the detailed description of the present invention herein describes a limited number of the embodiments of the present invention. Yet, various other embodiments of the present invention can be included in the scope of the present invention. Thus, the present invention should be interpreted in as broad a scope as possible so as to include all of the equivalent embodiments of the present invention.

I claim:

1. An improved method of fabricating nanowires, wherein the method comprises providing a template for growing the nanowires, such that the template comprises a multilayer stack of films comprising alternating substrate and inert insulating layers of films, in which the outer edges of the substrate and inert insulating layers are on the sides of the template, wherein the improvement comprises the following step of:

fabricating the nanowires on the outer edges of the multilayered template by a deposition process, wherein the nanowires are grown along the template by the deposition process which includes the application of precursor material, such that each of the nanowires is grown horizontally along the outer edge of one of the growth substrate layers on at least one side of the template, and such that each said nanowire is horizontally bonded to the outer edge of the substrate layer upon which the respective nanowire is grown, wherein the outer edge of each of the inert insulating film layers resists chemisorption of the precursor material which is applied for growing the nanowires in the deposition process, and wherein the inert insulating layers are respectively positioned between the substrate layers, such that the inert insulating film layers insulate the nanowires by providing one from the group of spatial separation or spatial separation and electrical resistivity.

2. The method of claim 1, wherein the deposition process is an atomic layer deposition process.

* * * * *